US006982224B2

(12) United States Patent
Cho

(10) Patent No.: US 6,982,224 B2
(45) Date of Patent: Jan. 3, 2006

(54) METHOD FOR FORMING METAL WIRES IN SEMICONDUCTOR DEVICE

(75) Inventor: Ihl Hyun Cho, Daejeon (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/878,360

(22) Filed: Jun. 29, 2004

(65) Prior Publication Data

US 2005/0233579 A1    Oct. 20, 2005

(30) Foreign Application Priority Data

Apr. 20, 2004  (KR) ..................... 10-2004-0027106

(51) Int. Cl.
*H01L 21/4763* (2006.01)
(52) U.S. Cl. .................. 438/637; 438/648; 438/960
(58) Field of Classification Search ............. 438/637, 438/639, 643, 645, 648, 672, 960
See application file for complete search history.

(56) References Cited

U.S. PATENT DOCUMENTS 6,521,526 B2 * 2/2003 Dong et al. ................ 438/637

2003/0042133 A1 * 3/2003 Lee et al. ............... 204/192.17

* cited by examiner

*Primary Examiner*—Phuc T. Dang
(74) *Attorney, Agent, or Firm*—Mayer, Brown, Rowe & Maw LLP

(57) ABSTRACT

The present invention provides a method that can prevent an anti-diffusion film from being formed defectively on a porous dielectric film due to pores in method for forming metal wires in a semiconductor device in which the porous dielectric film is used as an insulating film between metal wires. The method includes forming a porous dielectric film on a semiconductor substrate as an insulating film between metal wires, selectively etching the porous dielectric film to form an aperture defining a metal wire region, infiltrating sealing particles into pores of the porous dielectric film exposed on the sidewall of the aperture, implementing an annealing process for agglomerating the sealing particles to seal the entrances of the pores of the porous dielectric film exposed on the sidewall of the aperture, forming an anti-diffusion film at the bottom and on the sidewall of the aperture, forming a metal film on the anti-diffusion film, and polishing the metal film and the anti-diffusion film until the top of the porous dielectric film is formed to metal wires within the aperture.

12 Claims, 4 Drawing Sheets

METHOD FOR FORMING METAL WIRES IN SEMICONDUCTOR DEVICE

BACKGROUND

1. Field of the Invention

The present invention relates to a method for manufacturing a semiconductor device, and more specifically, to a method for forming metal wires in a semiconductor device.

2. Discussion of Related Art

As a semiconductor memory device is highly integrated, metal wires are multi-layered. The operating speed of the device is greatly influenced by RC delay among the metal wires. RC delay refers to a signal transfer delay phenomenon caused by parasitic capacitance (C) between the metal wires and an insulating film. The amount of RC delay depends on specific resistance of the metal wires and the dielectric constant of the insulating film between the wires. Therefore, if the metal wires are formed using a material of low specific resistance and the insulating film between the wires is formed using a material of a low dielectric constant, RC delay can be reduced.

In order to reduce RC delay, a method in which the metal wires are formed using a Cu film and the insulating film between the wires is formed using a porous dielectric film has been employed. The Cu wire is usually formed by means of the damascene process. The damascene process includes filling a wiring region defined in the insulating film between the wires with a metal film such as the Cu film.

Meanwhile, before the Cu film is formed, an anti-diffusion film is formed in order to prevent diffusion of Cu. If the anti-diffusion film is formed on the porous dielectric film, however, the anti-diffusion film is not continuously connected but broken or thinly formed due to pores exposed on the surface of the porous dielectric film. Accordingly, there occurs a problem that the properties of the anti-diffusion film formed on the porous dielectric film are degraded. That is, the anti-diffusion film formed defectively does not effectively prevent Cu within the Cu wire from being diffused into the porous dielectric film. Moreover, if bias thermal stress (BTS) is applied to the Cu wire, Cu can more easily slip toward the sidewall of the porous dielectric film, resulting in fail. In other words, as shown in FIG. 1, if the Cu wire is formed in the wiring region defined in the porous dielectric film by means of the damascene process and BTS is applied to the Cu wire, Cu is diffused and fail is thus generated.

SUMMARY OF THE INVENTION

The present invention is directed to a method for forming metal wires in a semiconductor device that can prevent an anti-diffusion film from being formed defectively on a porous dielectric film.

According to an aspect of the present invention, there is provided a method for forming metal wires in a semiconductor device, comprising the steps of forming a porous dielectric film on a semiconductor substrate as an insulating film between metal wires; selectively etching the porous dielectric film to form an aperture defining a metal wire region; infiltrating sealing particles into pores of the porous dielectric film exposed on the sidewall of the aperture; implementing an annealing process for agglomerating the sealing particles to seal the entrances of the pores of the porous dielectric film exposed on the sidewall of the aperture; forming an anti-diffusion film at the bottom and on the sidewall of the aperture; forming a metal film on the anti-diffusion film; and polishing the metal film and the anti-diffusion film until the top of the porous dielectric film is formed to metal wires within the aperture.

DETAILED DESCRIPTION OF PREFERRED EMBODIMENTS

Figure 1:
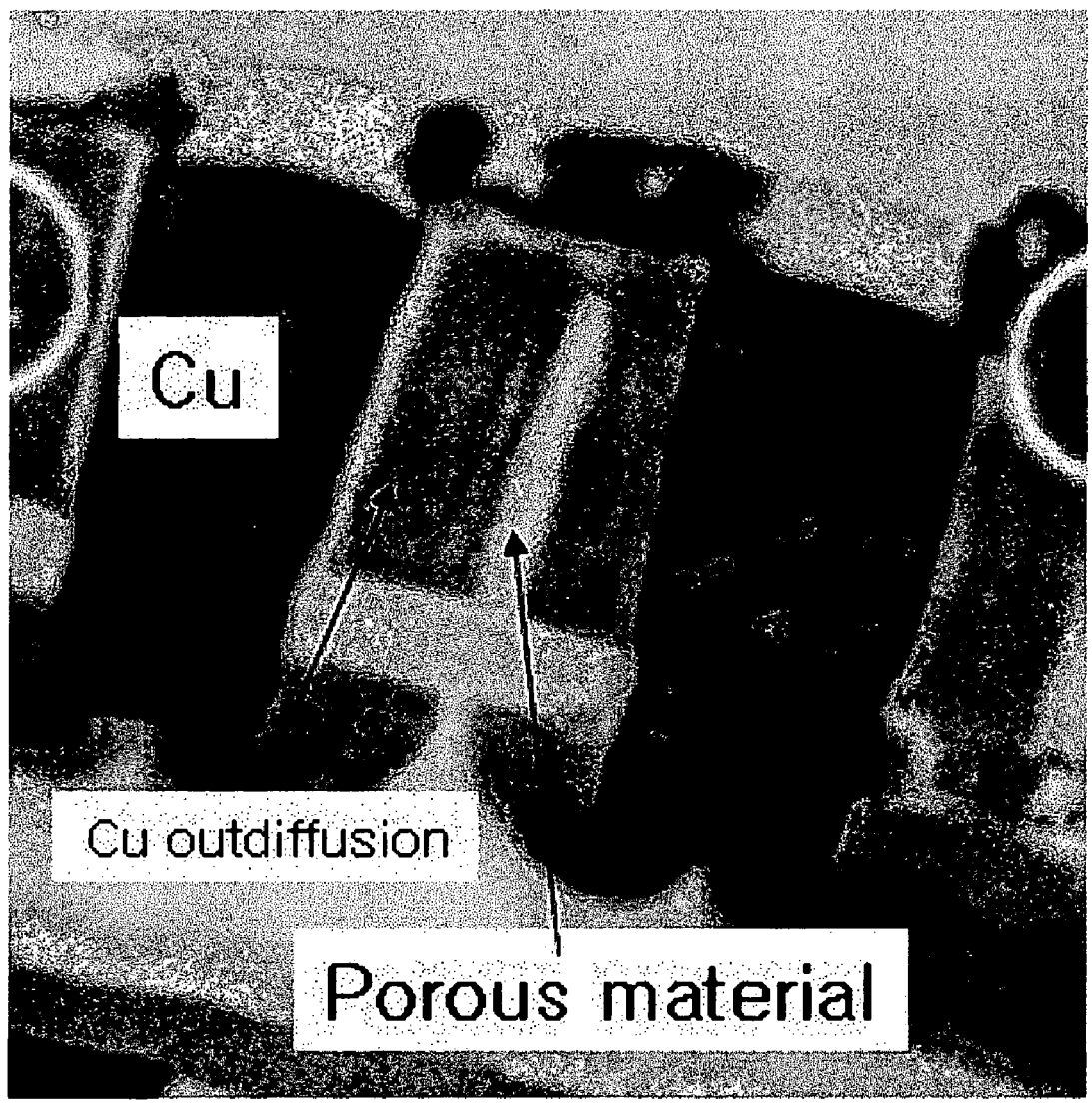
FIG. 1 is a scanning electron microscopy (SEM) photograph showing that Cu is diffused into a porous dielectric film upon formation of a Cu wire in the related art.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Further, in the drawing, the thickness and size of each layer are exaggerated for convenience of explanation and clarity. Like reference numerals are used to identify the same or similar parts. Meanwhile, in case where it is described that one film is "on" the other film or a semiconductor substrate, the one film may directly contact the other film or the semiconductor substrate. Or, a third film may be intervened between the one film and the other film or the semiconductor substrate.

Figure 2A:
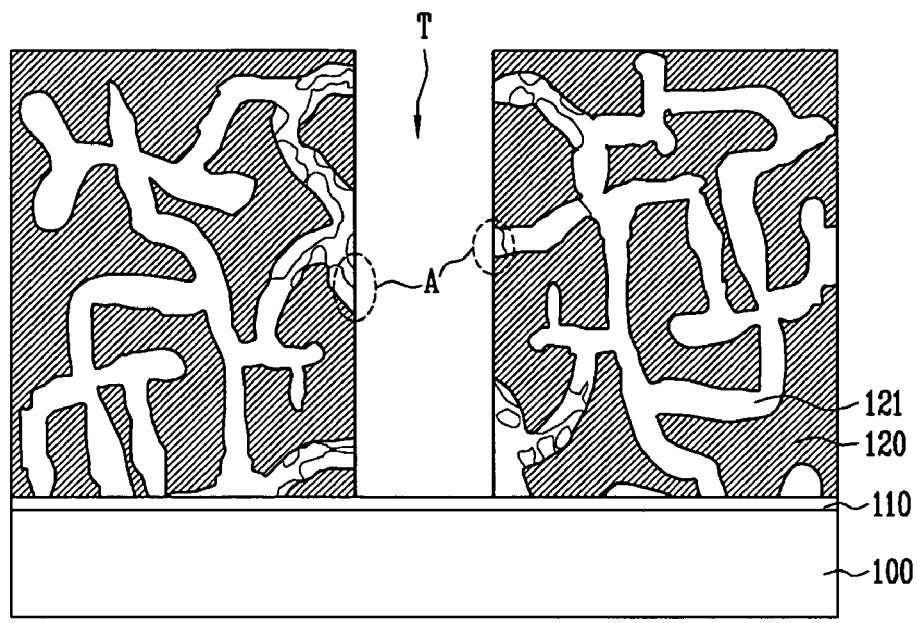
FIG. 2A to FIG. 2E are cross-sectional views shown to explain a method for forming metal wires in a semiconductor device according to an embodiment of the present invention.

Referring to FIG. 2A, a porous dielectric film 120 is formed on a semiconductor substrate 100 having an underlying structure. The porous dielectric film 120 has a plurality of pores 121 within its dielectric film. The entrances A of the pores are exposed on the surface of the porous dielectric film 120. According to an embodiment of the present invention, an aperture T defining a metal wire region can be formed in the porous dielectric film 120. The aperture T can be formed by forming an anti-etch film 110 and the porous dielectric film 120 on the semiconductor substrate 100 and selectively etching the porous dielectric film 120 and the anti-etch film 110. The entrances A of the pores of the porous dielectric film 120 are exposed on the side of the aperture T. Meanwhile, the aperture may include a trench and a via connected to the trench. That is, the present invention can be applied to a dual damascene structure.

It is preferred that the porous dielectric film 120 is formed using a low-dielectric constant material whose dielectric constant is below 2.5 considering RC delay. The porous dielectric film 120 can be formed in various methods. For example, the porous dielectric film having pores of 10 nm to 30 nm can be formed by curing a material of a sol state. Furthermore, the dielectric film having a porous structure can be formed by forming bonding among TEOS (tetraethoxysilane) particles and rapidly draining a solvent.

The anti-etch film 110 is formed using a material whose etch selective ratio is not as high as the porous dielectric film 120. If the porous dielectric film 120 is formed of a silicon oxide material, the anti-etch film 110 can be formed of a silicon nitride material.

Figure 2B:
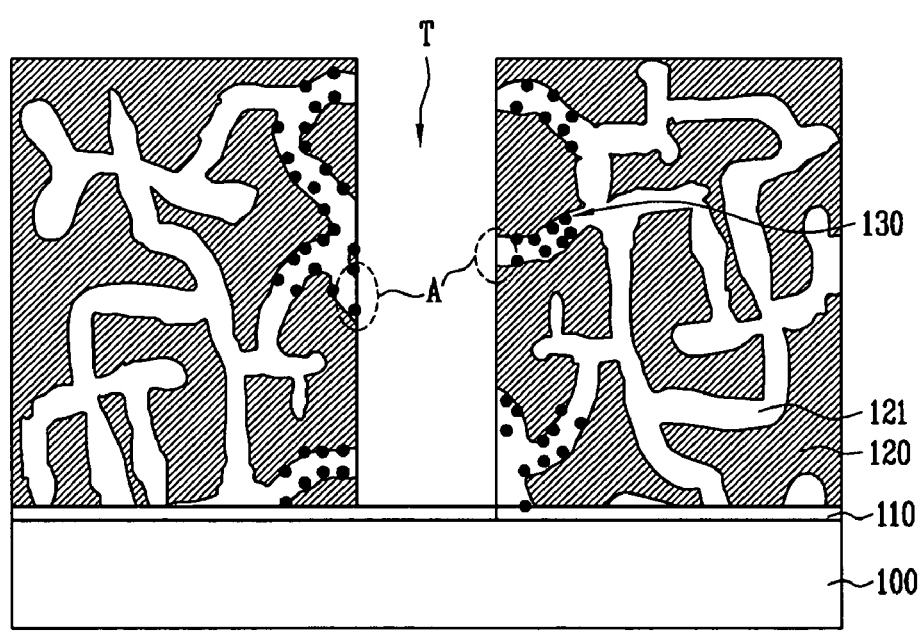

By reference to FIG. 2B, metallic particles 130 are infiltrated into the entrances A of the pores 121 exposed on the surface of the porous dielectric film 120 as sealing particles. That is, a solution containing the metallic particles 130 is impregnated into the porous dielectric film 120 and the metallic particles 130 are thus infiltrated into the entrances A of the pores exposed on the surface of the porous dielectric film 120. The metallic particles 130 of at least one kind selected from Pt, Ru and Pd can be infiltrated into the entrances A of the pores by using a solution in which at least one of $H_2PtCl_6$, $RuCl_3$ and $PdCl_2$ is dissolved.

After the solution is impregnated into the porous dielectric film 120, a primary annealing process can be performed at a temperature of 100° C. to 300° C.

Figure 2C:
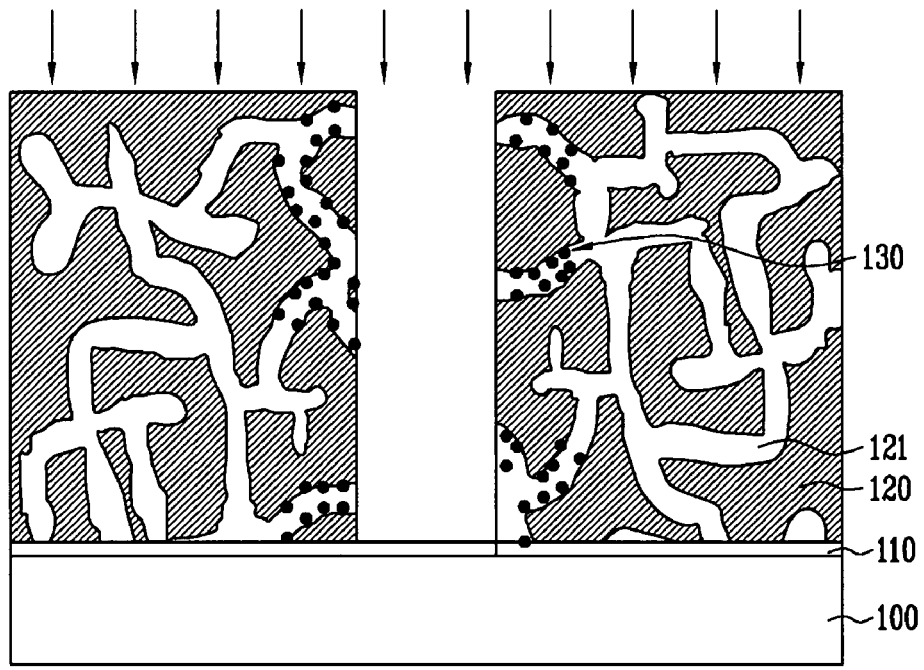
Figure 2D:
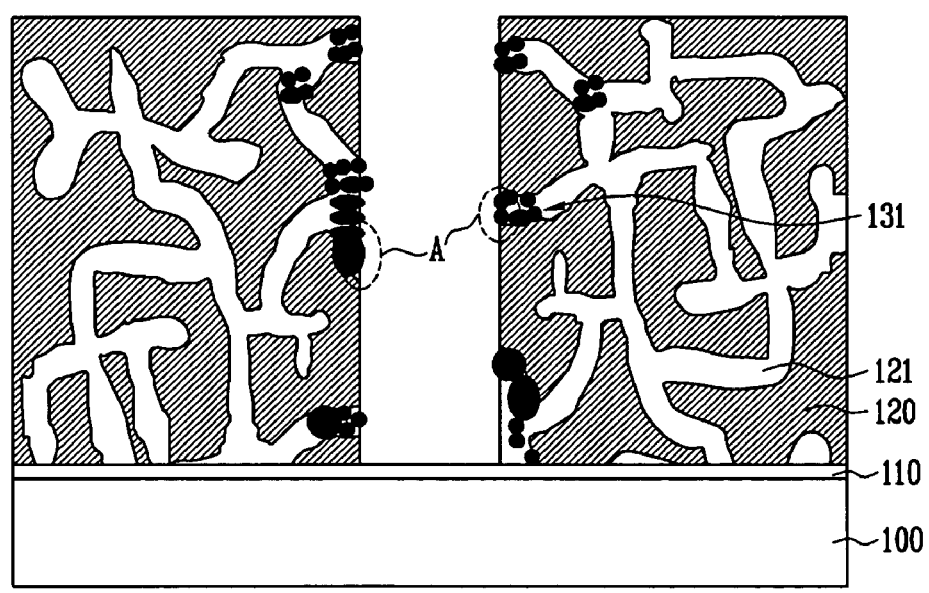

Referring to FIG. 2C, the semiconductor substrate 100 is moved into an annealing chamber (not shown) and a secondary annealing process is then performed. The secondary annealing process can be performed at a temperature of 200° C. to 600° C. under a $N_2$, Ar, $H_2$ or He gas atmosphere. By means of the secondary annealing process performed at high temperature, the metallic particles are agglomerated at the entrances A of the pores, as shown in FIG. 2D. The entrances A of the pores exposed on the surface of the porous dielectric film 120 are sealed by means of the agglomerated metallic particles 131.

Figure 2E:
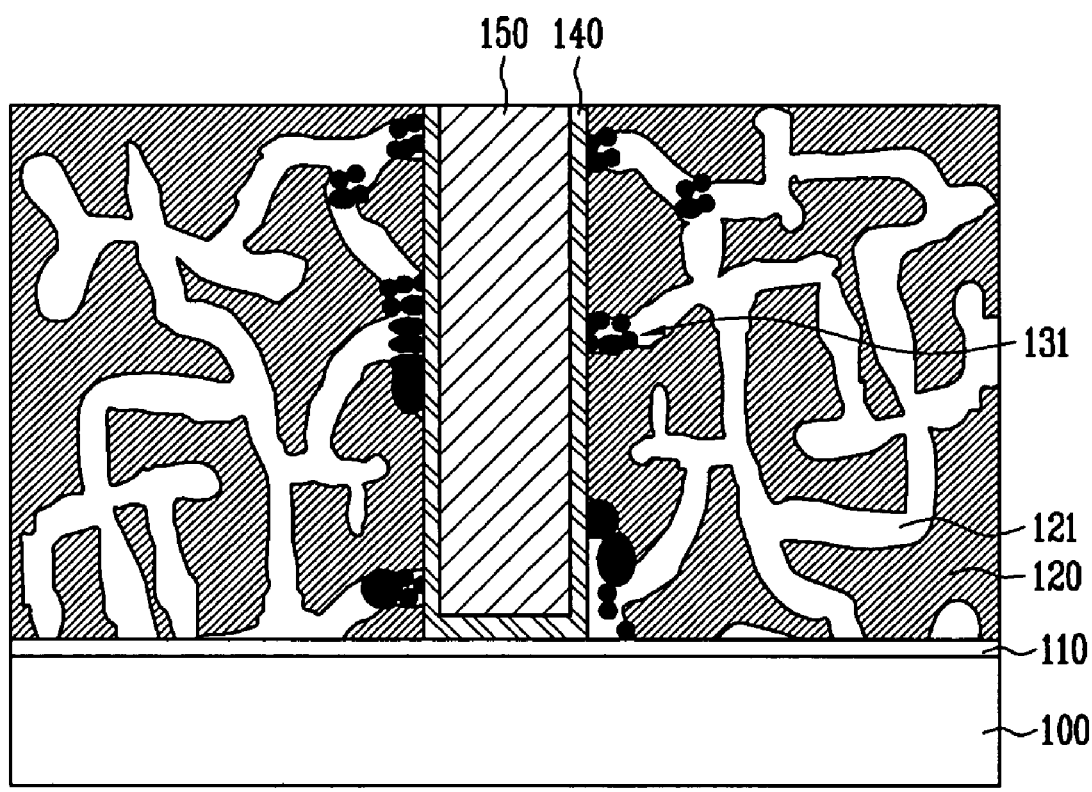

Referring to FIG. 2E, an anti-diffusion film 140 and a metal film 150 are sequentially formed on the porous dielectric film 120. A polishing process is then performed until the porous dielectric film 120 is exposed. At this time, the anti-diffusion film 140 is formed in a state where the entrances of the pore 121 exposed on the surface of the porous dielectric film 120 are sealed. Accordingly, the anti-diffusion film 140 can be finely formed without disconnection. In an embodiment of the present invention, the metal film 150 is formed using a Cu film and the anti-diffusion film is formed using a Ta film or a TaN film.

According to the present invention described above, sealing particles are infiltrated into entrances of pores of a porous dielectric film exposed on the sidewall of an aperture constituting a metal wire formation region. An annealing process is then performed to agglomerate the sealing particles, thus sealing the entrances of the pores. Next, an anti-diffusion film is implemented. It is therefore possible to form the anti-diffusion film on the surface of the porous dielectric film without disconnection. Accordingly, degradation in reliability of a device depending on diffusion of metal elements into metal wires can be prevented.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method for forming metal wires in a semiconductor device, comprising the steps of:

forming a porous dielectric film on a semiconductor substrate as an insulating film between metal wires;

selectively etching the porous dielectric film to form an aperture defining a metal wire region;

infiltrating sealing particles into pores of the porous dielectric film exposed on the sidewall of the aperture;

implementing an annealing process for agglomerating the sealing particles to seal the entrances of the pores of the porous dielectric film exposed on the sidewall of the aperture;

forming an anti-diffusion film at the bottom and on the sidewall of the aperture;

forming a metal film on the anti-diffusion film; and polishing the metal film and the anti-diffusion film until the top of the porous dielectric film is formed to metal wires within the aperture.

2. The method as claimed in claim 1, wherein the step of infiltrating the sealing particles into the pores of the porous dielectric film exposed on the sidewall of the aperture comprises the steps of:

impregnating a solution containing the sealing particles into the porous dielectric film; and annealing the porous dielectric film into which the solution is impregnated.

3. The method as claimed in claim 2, wherein the dielectric constant of the porous dielectric film is no more than 2.5.

4. The method as claimed in claim 3, wherein the porous dielectric film into which the solution is impregnated is annealed at a temperature of 100° C. to 300° C.

5. The method as claimed in claim 1, wherein the sealing particles are metallic particles of at least one kind.

6. The method as claimed in claim 5, wherein the sealing particles are metallic particles of at least one kind selected from Pt, Ru and Pd.

7. The method as claimed in claim 5, wherein at least one of $H_2PtCl_6$, $RuCl_3$ and $PdCl_2$ is dissolved into the solution containing the sealing particles.

8. The method as claimed in claim 5, wherein the annealing process for agglomerating the sealing particles is performed at a temperature of 200° C. to 600° C.

9. The method as claimed in claim 8, wherein the annealing process for agglomerating the sealing particles is performed under a $N_2$, Ar, $H_2$ or He gas atmosphere.

10. The method as claimed in claim 5, wherein the metal film is formed using a Cu film.

11. The method as claimed in claim 10, wherein the anti-diffusion film is formed using Ta or TaN.

12. The method as claimed in claim 5, wherein the aperture includes a trench and a via connected to the trench.

* * * * *